(12) United States Patent
Wojtaszek et al.

(10) Patent No.: US 7,666,471 B2
(45) Date of Patent: Feb. 23, 2010

(54) POLYIMIDE SUBSTRATE AND METHOD OF MANUFACTURING PRINTED WIRING BOARD USING THE SAME

(76) Inventors: Mark Wojtaszek, 15 Rockledge La., Canton, CT (US) 06019; James Watkowski, 100 Ravenwood Dr., Middlebury, CT (US) 06762; Gary B. Larson, 1310 Avon Blvd., Cheshire, CT (US) 06410; Peter Kukanskis, 245 Quassapaug Rd., Woodbury, CT (US) 06798

( * ) Notice: Subject to any disclaimer, the term of this patent is extended or adjusted under 35 U.S.C. 154(b) by 591 days.

(21) Appl. No.: 11/386,631

(22) Filed: Mar. 22, 2006

(65) Prior Publication Data
US 2007/0224346 A1 Sep. 27, 2007

(51) Int. Cl.
*B05D 3/02* (2006.01)
*B05D 3/04* (2006.01)
*C23C 14/02* (2006.01)
*H05H 1/00* (2006.01)

(52) U.S. Cl. .......... 427/229; 427/534; 427/536; 427/307; 427/304; 427/443.1; 216/58; 216/83

(58) Field of Classification Search .......... 427/534
See application file for complete search history.

(56) References Cited

U.S. PATENT DOCUMENTS

| | | | |
|---|---|---|---|
| 3,186,044 A | | 6/1965 | Ransley |
| 3,647,514 A | * | 3/1972 | Ahlgrim et al. ............. 427/306 |
| 3,652,351 A | * | 3/1972 | Guisti .......................... 216/83 |
| 3,653,351 A | * | 4/1972 | Martin ........................ 114/20.1 |
| 4,165,394 A | | 8/1979 | Ehrbar et al. |
| 5,340,451 A | | 8/1994 | Buchwalter et al. |
| 5,746,809 A | * | 5/1998 | Kanoh et al. ................ 106/1.11 |
| 6,440,576 B1 | | 8/2002 | Yamamoto et al. |
| 6,541,080 B1 | * | 4/2003 | Pies ............................ 427/532 |
| 6,632,344 B1 | | 10/2003 | Goldberg et al. |
| 2001/0007289 A1 | * | 7/2001 | Bhatt et al. .................. 174/262 |
| 2002/0134775 A1 | * | 9/2002 | Ohashi et al. ............. 219/444.1 |
| 2004/0018131 A1 | * | 1/2004 | Izumida et al. ................ 423/22 |
| 2004/0222103 A1 | * | 11/2004 | Marsales et al. ............. 205/158 |
| 2006/0230611 A1 | * | 10/2006 | Wakisaka ..................... 29/846 |

FOREIGN PATENT DOCUMENTS

| | | | |
|---|---|---|---|
| JP | 2001-073159 | * | 3/2001 |
| WO | WO/2004/080141 | * | 9/2004 |

OTHER PUBLICATIONS

Masaru, JP2001-073159, Englsih translation.*

* cited by examiner

*Primary Examiner*—Timothy H Meeks
*Assistant Examiner*—Joseph Miller, Jr.
(74) *Attorney, Agent, or Firm*—Carmody & Torrance LLP

(57) ABSTRACT

The present invention is directed to an improved method for metallizing polymer substrates, such as polyimides. The present invention comprises the steps of surface treating the polymer substrate with a plasma jet or corona discharge surface treatment, conditioning and etching the polymer substrate with an etching solution comprising a hydroxide and ionic palladium, activating the polymer substrate with ionic palladium, reducing the palladium on the polymer substrate, plating an electroless nickel layer onto the prepared polymer substrate, and plating an electroless copper layer over the electroless nickel layer. The process of the invention provides an improved method for preparing the polymer substrate for subsequent electrolytic plating thereon.

4 Claims, No Drawings

POLYIMIDE SUBSTRATE AND METHOD OF MANUFACTURING PRINTED WIRING BOARD USING THE SAME

FIELD OF THE INVENTION

The present invention is directed to an improved method for metallizing polymer substrates, in particular aromatic polymer substrates, such as polyimides.

BACKGROUND OF THE INVENTION

Substrates made of or containing aromatic polymers are often used in the construction of certain electronic assemblies, such as micro-electronic packaging. A large number of polymers have been found to be satisfactory for use as such substrates. Polyimides have been found to be particularly suitable in this regard, partly because of their excellent thermal stability and solvent resistance. One widely used and commercially available polyimide is sold under the trade name Kapton®, available from DuPont, Wilmington, Del. Other polyimides are sold under the tradenames Apical®, available from Kaneka High-Tech Materials and Upilex® and Upimol®, available from Uniglobe Kisco, Inc. and are also widely used.

Polyimides are extensively used in micro-electronic packaging applications such as flexible (Flex) circuits, rigid-flex circuits, printed circuit boards (PCB's), and multi-layer flexible circuits and as passivation layers on silicon chips. However, aromatic polymers, such as polyimides, by themselves tend to have poor adhesion with metals (such as copper, nickel and gold), which are subsequently plated thereon. In addition, when an electrolessly deposited metal is used as a conductive layer for additional deposition of a metal such as by electrolytic deposition, the adhesion between the polymer (polyimide) substrate, the electrolessly deposited metal and the electrolytically deposited metal must be sufficiently strong. Thus, it has been necessary to develop certain techniques for improving the adhesion between such metals and these substrates, and several methods have been adopted in order to attempt to overcome this problem with poor adhesion.

For example, an adhesive may be used to bond the metal layers to the polyimide film and, thereby, make metal-clad polymer films. Lithography is then used to pattern the metal layer. However, with these metal-clad films it is difficult to achieve fine line circuitry because etching of the metal layer leads to undercuts (due to etching underneath the mask) in the circuit lines and the metal layer needs to be relatively thick (at least 15 microns) to have sufficient mechanical strength for separate handling. Furthermore the adhesives used may cause difficulties in laser drilling of micro-vias.

Another method used to improve adhesion between the layers coats a liquid polyimide (or its precursor polyamic acid) onto a roughened metal foil (e.g. copper foil), followed by curing. However, fine line circuitry is again difficult to achieve due to the thickness of the metal foil.

Still another method used to improve adhesion is the sputtering of a thin layer of nickel and chromium onto the polyimide surface, followed by the sputtering of a thin layer of copper onto the chromium layer, which is thickened using electroplating. Although this method is able to produce fine line circuitry (by the use of a photoresist before the electroplating step), the sputtering steps are expensive and time consuming. The sputtering method also has the problems of the large size of its apparatus, high costs, and lower productivity as compared to other commonly used methods.

Therefore, additional efforts are needed to provide an improved method of preparing a non-conductive substrate for subsequent plating thereon that overcomes the drawbacks of the prior art.

SUMMARY OF THE INVENTION

It is an object of the present invention to provide an improved method for preparing a non-conductive substrate for subsequent plating thereon.

It is another object of the present invention to provide a process that is efficient to use and that achieves the production of a strong and adherent conductive layer on the non-conductive substrate.

It is still another object of the present invention to provide a process which produces printed circuits and flat flexible circuitry that is durable and inexpensive.

It is yet another object of the present invention to provide an improved conditioning and etching bath composition for the non-conductive substrate.

It is another object of the present invention to provide an improved electroless nickel plating bath for plating on non-conductive substrates.

These and other objectives of the invention are achieved in the method of the invention, in which a polymer substrate is prepared for subsequent electroplating in a process comprising the steps of:

a) treating at least a surface of a polymer substrate with a plasma jet or corona discharge surface treatment;

b) conditioning and etching the polymer substrate with an etching solution comprising an alkali metal hydroxide and ionic palladium;

c) activating the polymer substrate with ionic palladium;

d) reducing the palladium on the polymer substrate;

e) plating an electroless nickel layer onto the prepared polymer substrate; and f) plating an electroless copper layer over the electroless nickel layer.

DETAILED DESCRIPTION OF THE PREFERRED EMBODIMENTS

In particular, the present invention is directed to a method of preparing a polymer substrate for subsequent electroplating comprising the step of:

a) treating at least a surface of a polymer substrate with a plasma jet or corona discharge surface treatment;

b) conditioning and etching the polymer substrate with an etching solution comprising an alkali metal hydroxide and ionic palladium;

c) activating the polymer substrate with ionic palladium;

d) reducing the palladium on the polymer substrate;

e) plating an electroless nickel layer onto the prepared polymer substrate; and f) plating an electroless copper layer over the electroless nickel layer.

In a preferred embodiment, the polymer substrate is a polyimide film.

Once the electroless copper layer has been plated onto the prepared polymer substrate, the prepared polymer substrate may be coated with an electrolytic copper layer.

The above steps and procedures are preferably carried out with one or more steps of washing (i.e., rinsing), preferably with deionized water, after every step, where it is desired to remove from the substrate surface any contaminants or any of the materials or compositions which have come into contact with the substrate surface during the preceding step. The rinsing step assures that none of these materials or compositions will interfere with the procedures or applications of the succeeding step.

The above process is especially useful for electroless plating of a conductive metal layer to the surface of the non-conductive polymer substrate, such as printed circuit boards, particularly two-sided or multilayered boards containing a number of through-holes to be plated.

A typical processing sequence is as follows:

(1) Surface Treatment

The polyimide surface is first subjected to a plasma or corona discharge surface treatment in order to introduce ion exchange groups on the surface of the polyimide, which also acts to increase the surface tension of the polyimide film. The use of the plasma jet or corona discharge surface treatment increases the surface tension of the polyimide film from a approximate range of 50-52 dynes/cm to about 72 dynes/cm.

The term "corona" refers to electrical discharges that occur at substantially atmospheric pressure, and is to be distinguished from electrical discharges that occur under a vacuum, characterized by an intense, diffuse glow in the space between the anode and cathode, sometimes called "glow" discharge. If corona discharge is used, at least one surface of the polyimide film is exposed to a corona discharge in an atmosphere preferably containing nitrogen.

Plasma treatment may also be used to treat the surface of the polyimide film. The plasma treatment is not particularly limited, so long as it can introduce an appropriate ion exchange group onto the surface of the polyimide film, and may be a reduced pressure plasma treatment performed in a vacuum vessel at a reduced pressure or a normal pressure plasma treatment performed at or around an atmospheric pressure. Where the normal pressure plasma treatment is performed, a gas to be used is not particularly limited, but examples thereof include air, argon and nitrogen, which are typically employed in the art. The plasma treatment generates hydrophilic functional groups such as hydroxyl groups, carboxyl groups and carbonyl groups on the surface of the polyimide resin film.

In a preferred embodiment of the invention, plasma treatment is used to treat the surface of the polyimide film. However, either process is effective for modifying, or priming, a polyimide surface to improve adhesion and wettability properties of the surface.

It is preferable to process the film within 24 hours after application of the surface treatment in order to achieve maximum adhesion.

Once the surface treatment has been applied, the treated polyimide surface is preferably subjected to a water rinse to allow for wetting of the surface. The water rinse is typically carried out for about 30 to about 60 seconds at room temperature.

(2) Conditioning/Etching

Conditioning and/or etching of the polyimide film is typically carried out at a temperature of 145-165° F.

The conditioning/etching composition is an aqueous solution that typically comprises an alkali metal hydroxide at a concentration of from about 190 to 385 g/l. The conditioning/etching composition may also contain other ingredients such as palladium solubilizing compounds, surfactants and organic solvents.

The sodium hydroxide or potassium hydroxide mildly etches/softens the polyimide surface and allows for the palladium to bond to the surface. The present invention realizes a two-fold scenario in which the surface of the polyimide film is etched and palladium is also applied to the surface.

Thus the etching and/or conditioning solution also contains ionic palladium at from about 1.0 to 10.0 ppm.

The conditioning/etching solution may be applied by immersing the polyimide film in a bath of the solution. Alternatively, the conditioning/etching solution may be applied by spraying a layer of the solution onto at least one surface of the polyimide film. The surface or surfaces, which are to be subsequently activated, should be maintained in contact with the solution for a suitable period of time, which is typically a period of about 1 to 6 minutes. The palladium levels deposited onto the polyimide film from this step were shown to be in a range of about 0.2 to 0.7 ug/cm2.

Although the desired adhesion levels may vary depending on the end use of the polyimide film, it is generally preferable to achieve adhesion levels of about 0.7 kgf/cm of plate to film.

Thereafter, the conditioned and etched polyimide surface is subjected to a water rinse for about 3-5 minutes at room temperature to rinse the conditioning/etching composition off from the surface of the polyimide film.

(3) Ionic Palladium Activation

Next, the polyimide film is subjected to ionic palladium activation using a composition comprising:
  a) palladium sulfate
  b) preferably, an alkaline buffer such as borate.
  c) a chelator such as aminopyridine or equivalent.
  d) an alkali metal hydroxide The concentration of palladium in the composition may vary from about 20 to about 100 ppm in the working bath. The polyimide film is immersed in the ionic palladium bath for about 1-6 minutes at a temperature of about room temperature to about 140° F. The pH of the ionic palladium activation bath must be alkaline for optimal results and is typically in the range of about 9.5 to about 12.0, preferably about 11.2.

During the ionic palladium activation treatment, the polyimide film changes color from a mildly translucent canary yellow to light brown. The palladium level in the deposit was found to be in a range of 0.6 to 6.2 ug/cm2.

Solution movement is necessary to achieve optimum results.

After palladium activation, the polyimide surface is again subjected to a water rinse. The water rinse is performed at room temperature for about one minute and is a mild rinse to clean any debris off from the surface of the polyimide film.

(4) Acceleration or Reduction

Next, an acceleration or reduction step is performed on the activated surface of the polyimide film. The acceleration or reduction bath composition typically comprises:
  a) a reducing agent such as sodium hypophosphite.

The bath composition typically has a pH of about 5.0 to 5.5 and is applied at a temperature of about 100-110° F. for a period of about 1-5 minutes. The reduction step allows for the palladium reduction on the surface of the film to happen.

In order to remove particulates from the reduction solution, filtration may be needed. If used, this step is typically accomplished by recirculation through a canister type unit, although other means of solution filtration would also be known to one skilled in the art.

Once the acceleration or reduction step has been accomplished, a water rinse is again performed. The water rinse is typically performed at room temperature for about a minute, and is a mild rinse that cleans any possible debris off from the surface of the polyimide film.

(5) Electroless Nickel

Next, the prepared polyimide film is plated with an electroless nickel solution. One suitable electroless nickel solution is available from MacDermid, Inc. under the tradename Macuplex® J64. However, most commercially available electroless nickel solutions will work.

The electroless nickel solution typically comprises:
a) nickel salt
b) ammonia or an alkali metal hydroxide
c) a hypophosphite reducing agent
d) chelators such as citric acid.

The preferred electroless nickel solution contains about 6.0 to about 12.0 g/l of ammonium chloride, more preferably about 12 g/l of ammonium chloride, which aids in the adhesion of the electroless nickel to the polyimide film. The electroless nickel is typically applied at a temperature of about 85-90° F., and the inventors of the present invention have found that lower temperatures also help with the adhesion of the electroless nickel to the polyimide film.

A dark gray matte color is observed if adhesion of the electroless nickel to the polyimide film is good. When a shiny surface is observed, the adhesion may be compromised.

The electroless nickel preferably has a low-phosphorous type chemistry and typically contains about 3-5 percent phosphorus in the deposit. The thickness of the deposited layer is typically about 5-10 microinches.

Once the electroless nickel layer has been applied, a mild water rinse is performed for about 1 minute at room temperature.

(6) Electroless Copper

Once the electroless nickel has been plated onto the prepared polyimide substrate, electroless copper is plated over the top of the electroless nickel.

The electroless copper solution typically comprises
a) copper salt
b) alkali metal hydroxide
c) formaldehyde
d) chelators One suitable electroless copper solution is available from MacDermid, Inc. under the tradename M-15. However, most commercially available electroless copper solutions will work.

A dull copper appearance is seen once the electroless copper has been plated onto the nickel plated polyimide film. If a bright copper appearance is observed, adhesion to the substrate may be reduced.

While the temperature of the electroless copper solution is not critical, it is preferred that it be within the range of about 85 to about 115° F. The thickness of the copper deposit is not critical and is dependent on the specific needs of the customer. However, typically the thickness of the copper deposit is less than about 5 microinches. After electroless copper plating, the surface is then rinsed with a mild water rinse for about 1 minute at room temperature.

Once the electroless copper has been plated onto the polyimide film, the polyimide film is then ready for electrolytic plating of copper. Electrolytic copper plating bath compositions are known in the art and would be usable in the practice of the instant invention.

The inventors of the present invention have observed that the conditioning step performed without plasma treatment achieves the desired level of adhesion, while the plasma treatment step alone without the conditioning step does not achieve the desired level of adhesion. However, optimal adhesion levels are obtained when both plasma treatment and the conditioning step are utilized.

The use of the palladium activator in the conditioning and etching solution of the invention and the inclusion of ammonium chloride in the electroless nickel plating bath provide for increased adhesion of the polyimide substrate to the subsequently plated metal layers.

What is claimed is:

1. A method for metallizing a substrate comprising polyimide, said method comprising:
   (a) contacting the substrate with a surface treatment selected from the group consisting of plasma and corona discharge;
   (b) contacting the substrate with an etching solution comprising from about 190 to 385 g/l alkali metal hydroxide and from about 1 to 10 ppm ionic palladium;
   (c) contacting the substrate with an activating solution comprising ionic palladium and a chelator wherein the activating solution is alkaline in pH;
   (d) contacting the substrate with a reducing agent;
   (e) contacting the substrate with an electroless nickel plating bath wherein the electroless nickel plating bath comprises ammonium chloride; and
   (f) contacting the substrate with an electroless copper plating bath;
   wherein steps (b) and (c) comprise two separate steps with the etching solution and the activating solution being two separate solutions.

2. A method according to claim 1 wherein the activating solution comprises 20 to 100 ppm of ionic palladium.

3. A method according to claim 1 wherein the pH of the activating solution is between about 9.5 and 12.

4. A method according to claim 1 wherein the electroless nickel plating bath comprises from about 6 g/l to about 12 g/l or ammonium chloride.

* * * * *